(12) United States Patent
Yoo

(10) Patent No.: US 10,720,437 B2
(45) Date of Patent: Jul. 21, 2020

(54) FERROELECTRIC MEMORY DEVICE HAVING VERTICAL CHANNEL BETWEEN SOURCE LINE AND BIT LINE

(71) Applicant: SK hynix Inc., Icheon-si (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/162,043

(22) Filed: Oct. 16, 2018

(65) Prior Publication Data

US 2019/0259778 A1    Aug. 22, 2019

(30) Foreign Application Priority Data

Feb. 22, 2018    (KR) ........................ 10-2018-0021272

(51) Int. Cl.

| H01L 27/11502 | (2017.01) |
| H01L 29/51 | (2006.01) |
| H01L 27/11597 | (2017.01) |
| G11C 11/22 | (2006.01) |
| G11C 5/06 | (2006.01) |
| G11C 5/02 | (2006.01) |
| H01L 27/11504 | (2017.01) |
| H01L 27/11587 | (2017.01) |
| H01L 29/66 | (2006.01) |

(52) U.S. Cl.

CPC ........ H01L 27/11502 (2013.01); G11C 5/025 (2013.01); G11C 5/063 (2013.01); G11C 11/2275 (2013.01); H01L 27/11504 (2013.01); H01L 27/11587 (2013.01); H01L 27/11597 (2013.01); H01L 29/516 (2013.01); H01L 29/6684 (2013.01); H01L 2924/1441 (2013.01)

(58) Field of Classification Search

CPC ......... H01L 27/11502; H01L 27/11504; H01L 27/11585; H01L 27/11587; H01L 27/1159; H01L 29/516; H01L 29/6684; H01L 29/784; H01L 2924/1441; H01L 27/11597

See application file for complete search history.

(56) References Cited

U.S. PATENT DOCUMENTS

| 6,091,621 A | 7/2000 | Wang et al. |
| 8,385,098 B2 | 2/2013 | Hong et al. |
| 9,324,406 B2 | 4/2016 | Shuto et al. |
| 2015/0179657 A1* | 6/2015 | Inumiya ............... H01L 29/516 257/295 |
| 2016/0322368 A1* | 11/2016 | Sun ................... H01L 29/78391 |
| 2019/0066771 A1* | 2/2019 | Binfet ................... G11C 11/419 |
| 2019/0198111 A1* | 6/2019 | Higashi ................. G11C 16/32 |

FOREIGN PATENT DOCUMENTS

KR    10-0963132 B1    6/2010

* cited by examiner

Primary Examiner — Michael Jung

(57) ABSTRACT

A ferroelectric memory device according to an embodiment includes a base conduction layer, a channel layer extending in a vertical direction from the base conduction layer, a ferroelectric layer disposed on the channel layer, a plurality of ferroelectric memory cell transistor stacked in a vertical direction on the base conduction layer, a control transistor disposed over the plurality of ferroelectric memory cell transistors, and a bit line pattern electrically connected to the channel layer.

14 Claims, 17 Drawing Sheets

FERROELECTRIC MEMORY DEVICE HAVING VERTICAL CHANNEL BETWEEN SOURCE LINE AND BIT LINE

CROSS-REFERENCE TO RELATED APPLICATION

The present application claims priority under 35 U.S.C. 119(a) to Korean Patent Application No. 10-2018-0021272, filed on Feb. 22, 2018, which is herein incorporated by reference in its entirety.

BACKGROUND

1. Technical Field

Various embodiments of the present disclosure generally relate to a semiconductor device, and more particularly, relate to a ferroelectric memory device and a method of operating the same.

2. Related Art

Recently, a transistor type ferroelectric memory device for controlling polarization of a ferroelectric layer and storing signal information in a nonvolatile manner has been studied. The polarization may vary depending on the polarity or magnitude of a voltage applied to the ferroelectric layer and may be stored in the ferroelectric layer in the form of remanent polarization in a nonvolatile manner after the voltage is removed. Meanwhile, a predetermined remanent polarization may induce electric charges into a channel region of a substrate adjacent to the ferroelectric layer to change a channel resistance of the transistor. Accordingly, the remanent polarization, which is signal information stored in the ferroelectric layer, can be read by measuring the channel resistance.

Meanwhile, in recent years, studies on a structure of a highly integrated memory device that can guarantee both structural stability and operational reliability have continued in accordance with a decrease in design rule and an increase in integration degree. In addition, in accordance with the high performance of the electronic device, attempts to improve the information storage capability of memory devices have been made. For example, a memory cell structure capable of recording multi-level information in a single cell has emerged.

SUMMARY

There is disclosed a ferroelectric memory device according to an embodiment of the present disclosure. The ferroelectric memory device includes a base conduction layer, a channel layer extending in a vertical direction from the base conduction layer, a ferroelectric layer disposed on the channel layer, a plurality of ferroelectric memory cell transistor stacked in a vertical direction on the base conduction layer, a control transistor disposed over the plurality of ferroelectric memory cell transistors, and a bit line pattern electrically connected to the channel layer. Each of the ferroelectric memory cell transistors includes a portion of the ferroelectric layer and a memory gate electrode layer disposed on the ferroelectric layer in a horizontal direction. The control transistor includes a control dielectric layer disposed on the channel layer and a control gate electrode layer disposed on the control dielectric layer in a horizontal direction.

There is disclosed a method of operating a ferroelectric memory device according to another aspect of the present disclosure. In the method, there is provided a channel layer vertically extending from a base conduction layer disposed on a substrate, a ferroelectric layer, a plurality of ferroelectric memory cell transistors and a control transistor that share the channel layer, and a bit line pattern electrically connected to the channel layer. Each of the plurality of ferroelectric memory cell transistors includes a portion of the ferroelectric layer and a memory gate electrode and the control transistor includes a control dielectric layer and a control gate electrode layer. A polarization control current conducted along the channel layer is determined using the control transistor. The polarization control current is conducted along the channel layer between the base conduction layer and the bit line pattern. An operating voltage is applied to a memory gate electrode of a predetermined memory cell transistor among the plurality of ferroelectric memory cell transistors. A polarization in the ferroelectric layer of the predetermined memory cell transistor is written using the polarization control current.

There is disclosed a ferroelectric memory device according to another embodiment of the present disclosure. The ferroelectric memory device includes a base conduction layer, a channel layer extending in a vertical direction on the base conduction layer, a ferroelectric structure, a plurality of ferroelectric memory cell transistors stacked in a vertical direction on the base conduction layer, a bit line pattern electrically connected to the channel layer over the plurality of ferroelectric memory cell transistors. Each of the plurality of ferroelectric memory cell transistors includes a portion of the ferroelectric structure adjacent to the channel layer and a memory gate electrode layer disposed on the ferroelectric structure. The ferroelectric structure includes a plurality of ferroelectric layers. One or more of the ferroelectric layers has a different coercive field

DETAILED DESCRIPTION

Figure 1:
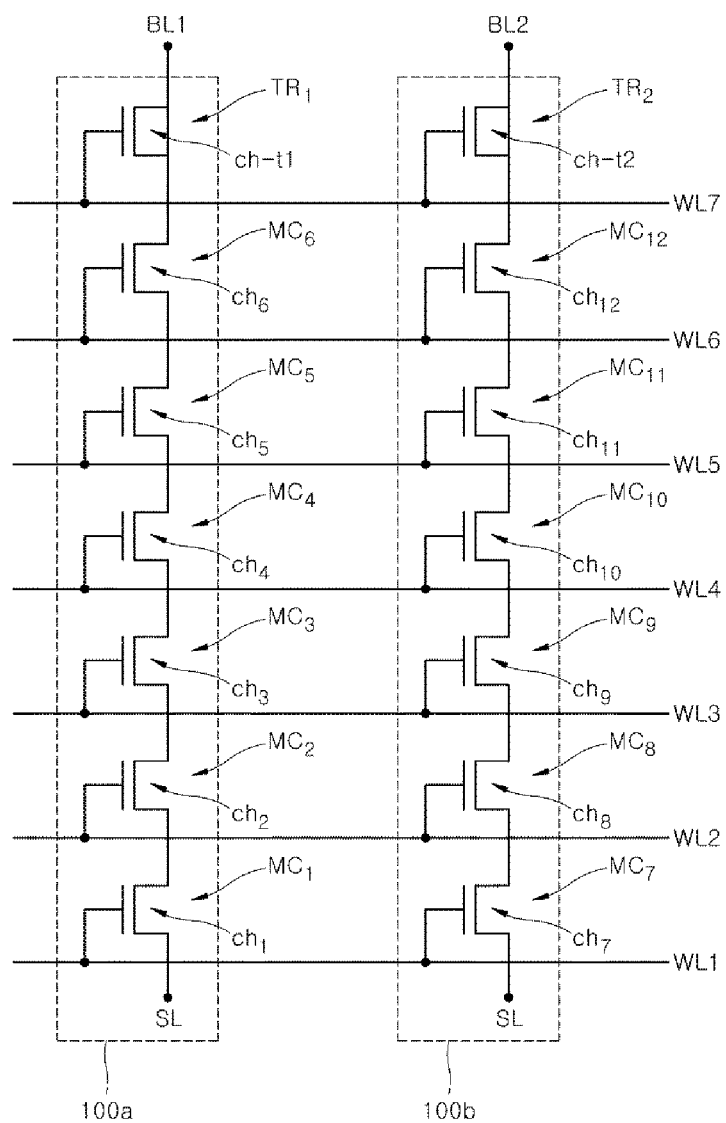
FIG. 1 is a circuit diagram schematically illustrating a ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as a stated order, may be performed substantially at the same time, or may be performed in a reverse order.

Embodiments of the present disclosure provide a ferroelectric memory device having ferroelectric memory cell transistors and a control transistor and a method of operating the same. FIG. 1 is a circuit diagram schematically illustrating a ferroelectric memory device 1 according to an embodiment of the present disclosure. Referring to FIG. 1, the ferroelectric memory device 1 may include a cell array having a plurality of strings 100a and 100b. One end of each of the strings 100a and 100b may be connected to a common source line SL and the other end of each of the strings 100a and 100b may be connected to different bit lines BL1 and BL2, respectively. In FIG. 1, although the strings constituting the cell array are illustrated as two strings for convenience of explanation, that is, the first string 100a and the second string 100b, the present disclosure is not necessarily limited thereto, and the number of the strings constituting the cell array is not limited to two.

The first string 100a may have first to sixth memory cell transistors $MC_1$, $MC_2$, $MC_3$, $MC_4$, $MC_5$ and $MC_6$ that are connected in series to each other and a first control transistor $TR_1$. The first control transistor $TR_1$ may be arranged between the sixth memory cell transistor $MC_6$ and a first bit line BL1. The second string 100b may have seventh to twelfth memory cell transistors $MC_7$, $MC_8$, $MC_9$, $MC_{10}$, $MC_{11}$ and $MC_{12}$ that are connected in series to each other and a second control transistor $TR_2$. The second control transistor $TR_2$ may be arranged between the twelfth memory cell transistor $MC_{12}$ and a second bit line BL2.

Each of the first to twelfth memory cell transistors $MC_1$, $MC_2$, $MC_3$, $MC_4$, $MC_5$, $MC_6$, $MC_7$, $MC_8$, $MC_9$, $MC_{10}$, $MC_{11}$ and $MC_{12}$ may have a ferroelectric layer as a gate dielectric layer. At this time, the ferroelectric layer can perform a memory function by storing internal polarization in a nonvolatile manner. Each of the first and second control transistors $TR_1$ and $TR_2$ may include a paraelectric layer as a gate dielectric layer. The first and second control transistors $TR_1$ and $TR_2$ may perform a switching function for turning the current flow on and off between the first bit line BL1 and the source line SL and the second bit line BL2 and the source line SL, respectively. The first and second control transistors $TR_1$ and $TR_2$ may also perform a function for controlling the amount of channel current flowing through channel layers ch-t1 and ch-t2, respectively. The controlled channel current may be provided into first to twelfth channel layers $ch_1$, $ch_2$, $ch_3$, . . . , $ch_{10}$, $ch_{11}$ and $ch_{12}$ of the first to twelfth memory cell transistors $MC_1$, $MC_2$, $MC_3$, . . . , $MC_{10}$, $MC_{11}$ and $MC_{12}$. The channel current may function as a polarization control current for the ferroelectric layer of the corresponding first through twelfth memory cell transistors $MC_1$, $MC_2$, $MC_3$, . . . , $MC_{10}$, $MC_{11}$ and $MC_{12}$ while passing through the first to twelfth channel layers $ch_1$, $ch_2$, $ch_3$, . . . , $ch_{10}$, $ch_{11}$ and $ch_{12}$.

Although, in FIG. 1, it is illustrated that each of the first and second strings 100a and 100b includes six memory cell transistors for the convenience of explanation, the present disclosure is not necessarily limited thereto and the number of the memory cell transistors constituting the first and second strings 100a and 100b is not limited to any particular number. In addition, in some other embodiments not illustrated herein, the first control transistor $TR_1$ may be disposed between the source line SL and the first memory cell transistor $MC_1$ instead. Further, the second control transistor $TR_2$ may be disposed between the source line SL and the seventh memory cell transistor $MC_7$, unlike the configuration illustrated in FIG. 1.

The first to sixth memory cell transistors $MC_1$, $MC_2$, $MC_3$, $MC_4$, $MC_5$ and $MC_6$ in the first string 100a may be connected to first to sixth word lines WL1, WL2, WL3, WL4, WL5 and WL6, respectively. The first control transistor $TR_1$ may be connected to the seventh word line WL7. Likewise, the seventh to twelfth memory cell transistors $MC_7$, $MC_8$, $MC_9$, $MC_{10}$, $MC_{11}$ and $MC_{12}$ may be connected to the first to sixth word lines WL1, WL2, WL3, WL4, WL5 and WL6, respectively. The second control transistor $TR_2$ may be connected to the seventh word line WL7.

The first to sixth word lines WL1, WL2, WL3, WL4, WL5 and WL6 may provide an operation voltage or a write voltage to a memory gate electrode layer of each of the first to sixth memory cell transistors MC1, MC2, MC3, MC4, MC5 and MC6. The operation voltage may be, as an example, a first write voltage having a magnitude less than a magnitude of a voltage corresponding to an absolute value of a coercive field of the ferroelectric material layer. The first write voltage cannot cause polarization switching to occur in the ferroelectric layer, but it can set a predetermined conductivity into a channel layer allowing carriers to move through the channel layer. As another example, the write voltage may be a second write voltage having a magnitude greater than a magnitude of a voltage corresponding to an absolute value of a coercive electric field of the ferroelectric layer. In this case, the second write voltage can cause the polarization switching of the ferroelectric layer to occur, while at the same time imparting a predetermined conductivity into the channel layer that allows carriers to move through the channel layer.

The seventh word line WL7 may provide a control voltage applied to a control gate electrode layer of each of the first and second control transistors $TR_1$ and $TR_2$. A magnitude of a current passing through the first control channel layer ch-t1 or the second control channel layer ch-2 can be adjusted by changing the magnitude of the control voltage while a predetermined voltage is applied between the source line SL and the first bit line BL1 or between the source line SL and the second bit line BL2. As an example, when the magnitude of the control voltage is increased, the current passing through the first control channel layer ch-t1 or the second control channel layer ch-t2 can be increased to a predetermined saturation current.

In an embodiment, when a first write voltage is applied to the memory gate electrodes of the first to sixth memory cell transistors $MC_1$, $MC_2$, $MC_3$, $MC_4$, $MC_5$ and $MC_6$ and a predetermined control voltage is applied to the control gate electrode layer, a channel current that functions as a polarization control current may be provided into the first and sixth channel layers $ch_1$, $ch_2$, $ch_3$, $ch_4$, $ch_5$ and $ch_6$ and the first control channel layer ch-t1. Then, when a second write voltage is applied to a memory gate electrode layer of one or more memory cell transistors selected from the first to sixth memory cell transistors $MC_1$, $MC_2$, $MC_3$, $MC_4$, $MC_5$ and $MC_6$, the polarization control current results in polarization switching of an electrical dipole in the ferroelectric layer of the selected one or more memory cell transistors. The above-described polarization switching results in a write operation performed in the selected one or more memory cell transistors.

In the same manner, the control voltage provided by the seventh word line WL7 can control a channel current of the second control transistor $TR_2$. The channel current that functions as the polarization control current may be provided to the seventh to twelfth channel layers $ch_7$, $ch_8$, $ch_9$, $ch_{10}$, $ch_{11}$ and $ch_{12}$ corresponding to the seventh to twelfth memory cell transistors $MC_7$, $MC_8$, $MC_9$, $MC_{10}$, $MC_{11}$ and $MC_{12}$. When the second write voltage is applied to a memory gate electrode layer of at least one memory cell transistors selected from the seventh to twelfth memory cell transistors $MC_7$, $MC_8$, $MC_9$, $MC_{10}$, $MC_{11}$ and $MC_{12}$, a write operation to the at least one memory cell transistor can be performed by the polarization control current.

Meanwhile, after the application of the second write voltage and polarization control current is complete, the ferroelectric layers of each switched memory cell transistor can maintain its switched polarization state. That is, the switched polarization states in the ferroelectric layers of the first to twelfth memory cell transistors $MC_1$, $MC_2$, $MC_3$, . . . , $MC_{10}$, $MC_{11}$ and $MC_{12}$ can be stored in a nonvolatile manner such that the first to twelfth memory cell transistors $MC_1$, $MC_2$, $MC_3$, . . . , $MC_{10}$, $MC_{11}$ and $MC_{12}$ can be used in memory operations.

According to the method of operating a ferroelectric memory device according to an embodiment of the present disclosure, the polarization states stored in each of the ferroelectric layers of the memory cell transistors $MC_1$, $MC_2$, $MC_3$, . . . , $MC_{10}$, $MC_{11}$ and $MC_{12}$ may each have a plurality of different states depending on the magnitude of the polarization control current. Thus, multi-level signal information can be stored in a single memory cell transistor.

Meanwhile, in a read operation of the ferroelectric memory device 1, the channel layers $ch_1$, $ch_2$, $ch_3$, . . . , $ch_{10}$, $ch_{11}$ and $ch_{12}$ of the memory cell transistors $MC_1$, $MC_2$, $MC_3$, . . . , $MC_{10}$, $MC_{11}$ and $MC_{12}$ may have different resistances, corresponding to the polarization states stored nonvolatilely in the ferroelectric layers. At this time, the total channel resistance of the first string 100a may be determined by the sum of the channel resistances of the memory cell transistors $MC_1$, $MC_2$, $MC_3$, $MC_4$, $MC_5$ and $MC_6$ connected in series. As a result, the first string 100a can have a plurality of different resistances corresponding to the polarization states stored in the ferroelectric layers of the memory cell transistors $MC_1$, $MC_2$, $MC_3$, $MC_4$, $MC_5$ and $MC_6$. Accordingly, a read operation can be performed, the outcome of which depends on the different resistances of the first string 100a. In the same way, the second string 100b can have a plurality of different resistances, corresponding to the polarization states stored in the ferroelectric layers of the memory cell transistors $MC_7$, $MC_8$, $MC_9$, $MC_{10}$, $MC_{11}$ and $MC_{12}$. Accordingly, a read operation can be performed that depends on the different resistances of the second string 100b.

According to an embodiment, a ferroelectric memory device may be implemented in a three-dimensional structure in which a plurality of memory cell transistors and a control transistor are stacked vertically between a source line and a bit line pattern, as described below.

Figure 2:
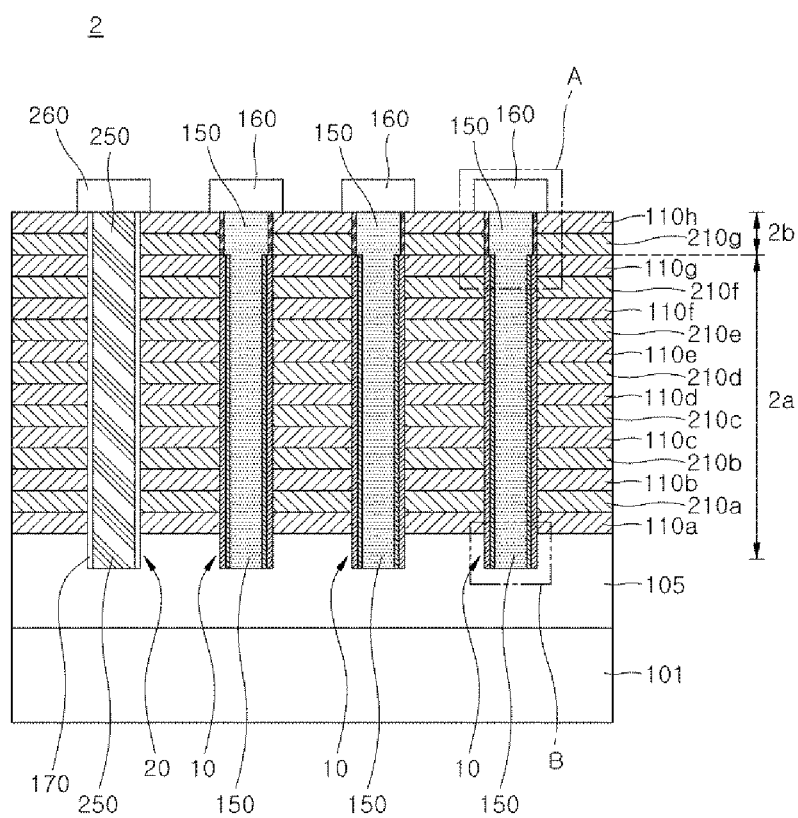
FIG. 2 is a cross-sectional view schematically illustrating a ferroelectric memory device according to an embodiment of the present disclosure.
Figure 3A:
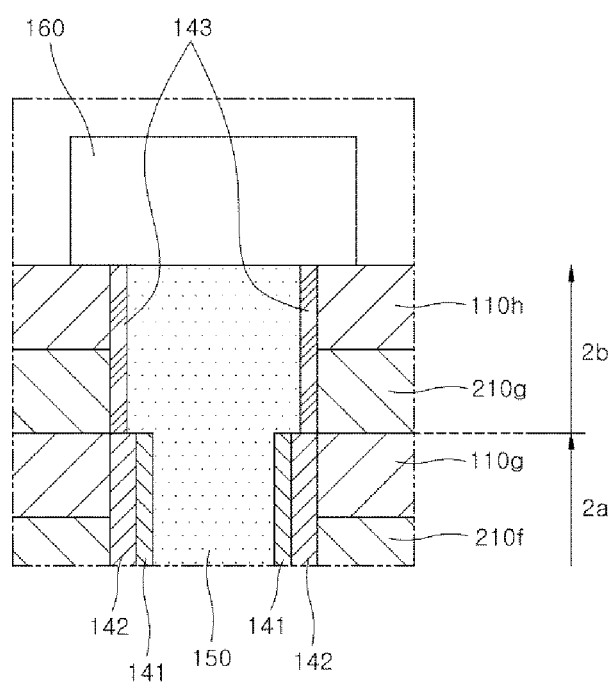
FIG. 3A is an enlarged view of region A of FIG. 2.

FIG. 2 is a cross-sectional view schematically illustrating a ferroelectric memory device 2 according to an embodiment of the present disclosure. FIG. 3A is an enlarged view of the region A of FIG. 2 and FIG. 3B is an enlarged view of the region B of FIG. 2.

Figure 3B:
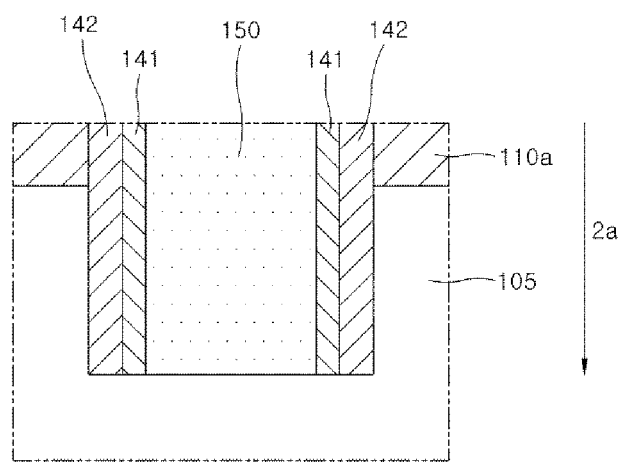
FIG. 3B is an enlarged view of region B of FIG. 2.

Referring to FIGS. 2, 3A and 3B, the ferroelectric memory device 2 may include a substrate 101, a base conduction layer 105, a channel layer 150, a ferroelectric layer 142, a plurality of memory cell transistors 2a, a control transistor 2b and a bit line pattern 160. The control transistor 2b may be disposed over the plurality of memory cell transistors 2a and connected to the bit line pattern 160. The channel layer 150 may extend from the base conduction layer 105 in a first or vertical direction. The plurality of memory cell transistors 2a and the control transistor 2b may share the channel layer 150.

The substrate 101 may be a semiconductor substrate. The semiconductor substrate may, for example, be a silicon (Si) substrate, a gallium arsenide (GaAs) substrate, an indium phosphide (InP) substrate, a germanium (Ge) substrate, or a silicon germanium (SiGe) substrate. The semiconductor substrate may be doped with n-type or p-type dopants to have conductivity. In another embodiment, the substrate 101 may be an insulative substrate such as a silicon-on-insulator (SOI) substrate. Although not illustrated, the substrate 101 may include a well formed by doping an n-type or p-type dopant. Various types of integrated circuits may be disposed between the substrate 101 and the base conduction layer 105.

The base conduction layer 105 may be disposed on the substrate 101. In an embodiment, the base conduction layer 105 may, for example, be a conductive film including metal, metal nitride or metal silicide. In another embodiment, when the substrate 101 is a semiconductor substrate, the base conduction layer 105 may be a region of the substrate 101, which is doped with an n-type dopant or a p-type dopant.

First to eighth interlayer insulating layers 110a, 110b, 110c, 110d, 110e, 110f, 110g and 110h and first to seventh gate electrode layers 210a, 210b, 210c, 210d, 210e, 210f and 210g may be stacked alternately. The first interlayer insulating layer 110a may be in contact with the base conduction layer 105. The plurality of memory cell transistors 2a may include first to sixth gate electrode layers 210a, 210b, 210c, 210d, 210e and 210f as memory gate electrodes, together with portions of ferroelectric layer 142 that corresponds to each of the first to sixth gate electrode layers 210a, 210b, 210c, 210d, 210e and 210f. The first to sixth gate electrode layers 210a, 210b, 210c, 210d, 210e and 210f are disposed in a second or horizontal direction on the ferroelectric layer 142. The plurality of memory cell transistors 2a may also include the first to seventh interlayer insulating layers 110a, 110b, 110c, 110d, 110e, 110f, and 110g. The control transistor 2b may have the seventh gate electrode layer 210g as a gate electrode layer. Control transistor 2b may also include the eighth interlayer insulating layer 110h. Although FIG. 2 illustrates six memory cell transistors corresponding to the first to sixth gate electrode layers 210a, 210b, 210c, 210d, 210e and 210f for the convenience of description, the number of the memory cell transistors may not be limited thereto. In other words, in other embodiments, the plurality of memory cell transistors 2a may have various other numbers of memory cell transistors and other numbers of interlayer insulating layers, alternately stacked in the second or vertical direction, corresponding to a different number of memory cell transistors.

In an embodiment, the first to eighth interlayer insulating layers 110a, 110b, 110c, 110d, 110e, 110f, 110g and 110h may include, for example, insulative oxide, insulative nitride, insulative oxynitride and the like. The first to eighth interlayer insulating layers 110a, 110b, 110c, 110d, 110e, 110f, 110g and 110h may include, for example, silicon oxide, silicon nitride, or silicon oxynitride. The first to seventh gate electrode layers 210a, 210b, 210c, 210d, 210e, 210f and 210g may include, for example, metal, conductive metal nitride, conductive metal silicide, conductive metal oxide, conductive metal carbide and the like. The first to seventh gate electrode layers 210a, 210b, 210c, 210d, 210e, 210f and 210g may include, for example, tungsten (W), titanium (Ti), copper (Cu), ruthenium (Ru), tungsten nitride (WN), titanium nitride (TiN), tantalum nitride (TaN), ruthenium oxide ($RuO_2$), tungsten carbide (WC), titanium carbide (TiC), tungsten silicide ($WSi_2$), titanium silicide ($TiSi_2$), tantalum silicide ($TaSi_2$) or a combination of two or more thereof.

Referring again to FIG. 2, first trenches 10 may be formed to penetrate the first to eighth interlayer insulating layers 110a, 110b, 110c, 110d, 110e, 110f, 110g and 110h and the first to seventh gate electrode layers 210a, 210b, 210c, 210d, 210e, 210f and 210g to expose the base conduction layer 105. In a first trench 10, the channel layer 150 extending in the vertical direction may be disposed on the base conduction layer 105. The channel layer 150 may include a doped semiconductor material. The doped semiconductor material may include, for example, silicon having an n-type dopant or a p-type dopant. As an example, the channel layer 150 may, for example, be a silicon layer doped with an n-type dopant at a concentration of about $10^{16}/cm^3$ or more. The n-type dopant may include, for example, phosphorus (P), arsenic (As) and the like.

Referring to FIGS. 2 and 3A, an interfacial insulating layer 141 and a ferroelectric layer 142 may be disposed between the channel layer 150 and the first to sixth gate electrode layers 210a, 210b, 210c, 210d, 210e and 210f. Likewise, the interfacial insulating layer 141 and a ferroelectric layer 142 may be disposed between the channel layer 150 and the first to seventh interlayer insulating layers 110a, 110b, 110c, 110d, 110e, 110f and 110g. Ferroelectric layer 142 can store signal information of the corresponding memory cell transistors. The first to sixth gate electrode layers 210a, 210b, 210c, 210d, 210e and 210f can function as memory gate electrodes of the plurality of memory cell transistors 2a, respectively. In an embodiment, the first to sixth gate electrode layers 210a, 210b, 210c, 210d, 210e and 210f may be disposed on and may contact the ferroelectric layer 142.

The interfacial insulating layer 141 may serve as a buffer layer for preventing direct contact between the channel layer 150 and the ferroelectric layer 142. When the channel layer 150 and the ferroelectric layer 142 are in direct contact with each other, defect sites may be generated at a junction interface, and the electrical retention of the ferroelectric layer 142 may be degraded or impaired during memory operations. The interfacial insulating layer 141 may have an amorphous structure. The interfacial insulating layer 141 may include, for example, silicon oxide, silicon nitride, aluminum oxide, silicon oxynitride and the like.

The ferroelectric layer 142 may include a ferroelectric material. The ferroelectric material may include, for example, hafnium oxide, zirconium oxide, hafnium zirconium oxide or a combination of two or more thereof. The ferroelectric layer 142 may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Ga) or a combination of two or more thereof.

In an embodiment, a control dielectric layer 143 may be disposed between the channel layer 150 and the seventh gate electrode layer 210g. Alternatively, the seventh gate electrode layer 210g may be disposed on and may contact the channel layer 150. Likewise, the control dielectric layer 143 may be disposed between the channel layer 150 and the eighth interlayer insulating layer 110h. The control dielectric layer 143 may have a paraelectric characteristic. In an embodiment, no ferroelectric layer may be disposed between the channel layer 150 and the seventh gate electrode layer 210g.

Since the control dielectric layer 143 has a paraelectric characteristic, no polarization state is stored in the control dielectric layer 143. Therefore, the control dielectric layer 143 does not function as a memory element and does not affect remanent polarization stored in the ferroelectric layer 142. The control dielectric layer 143 may include a paraelectric material such as silicon oxide, silicon nitride, aluminum oxide, silicon oxynitride, hafnium oxide, zirconium oxide and the like. Meanwhile, in the case of the hafnium oxide and zirconium oxide, the control dielectric layer 143 may be selected to have a paraelectric property by controlling the stoichiometric ratio, controlling a dopant to be injected and the like.

The bit line pattern 160 electrically connected to the channel layer 150 may be disposed over the control transistor 2b. The bit line pattern 160 may be a portion of a bit line or a connection pattern electrically connected to a bit line. The bit line pattern 160 may include, for example, metal, conductive metal nitride, conductive metal silicide and the like.

Referring to FIG. 3B, the channel layer 150 may be in contact with the base conduction layer 105. Accordingly, the channel layer 150 may function as a path of charge conduction between the base conduction layer 105 and the bit line pattern 160. The first interlayer insulating layer 110a is disposed directly above the base conduction layer 105 to prevent conduction between the base conduction layer 105 and the first gate electrode layer 210a.

Referring again to FIG. 2, second trenches 20 may be formed to penetrate the first to eighth interlayer insulating layers 110a, 110b, 110c, 110d, 110e, 110f, 110g and 110h and the first to seventh gate electrode layers 210a, 210b, 210c, 210d, 210e, 210f and 210g expose the base conduction layer 105. A liner insulating layer 170 may be disposed on sidewalls of the second trench 20. The liner insulating layer 170 may include, for example, insulative oxide, insulative nitride, or insulative oxynitride.

A first source line connection pattern 250 may be disposed inside the second trench 20. A second source line connection pattern 260 connected to the first source line connection pattern 250 may be disposed outside the second trench 20. The first and second source line connection patterns 250 and 260 can electrically connect the base conduction layer 105 to a source line (not shown). The first and second source line connection patterns 250 and 260 may include metal, conductive metal nitride, conductive metal oxide, conductive metal carbide, or conductive metal silicide. The first and second source line connection patterns 250 and 260 may include, for example, tungsten (W), titanium (Ti), copper (Cu), ruthenium (Ru), tungsten nitride (WN), titanium nitride (TiN), tantalum nitride (TaN), ruthenium oxide ($RuO_2$), tungsten carbide (WC), titanium carbide (TiC), tungsten silicide ($WSi_2$), titanium silicide ($TiSi_2$), tantalum silicide ($TaSi_2$) or a combination of two or more thereof.

As described above, the ferroelectric memory device 2 may have the channel layer 150 extending vertically from the base conduction layer 105. The plurality of memory cell transistors 2a and the control transistor 2b may share the channel layer 150. A channel current provided between the base conduction layer 105 and the bit line pattern 160 along the channel layer 150 can be controlled through a control voltage applied to the seventh gate electrode layer 210g, which is the control gate electrode layer of the control transistor 2b. The channel current may function as a polarization control current for the ferroelectric layer.

According to an embodiment, when a second write voltage having a size greater than that of a voltage corresponding to a coercive electric field of the ferroelectric layer 142 is applied to a gate electrode layer of one or more memory cell transistors selected among the plurality of memory cell transistors 2a, the polarization control current can switch the polarization of the ferroelectric layer in at least one memory cell transistor. Through the polarization switching operation, the write operation to the at least one memory cell transistor can be performed.

Figure 4:
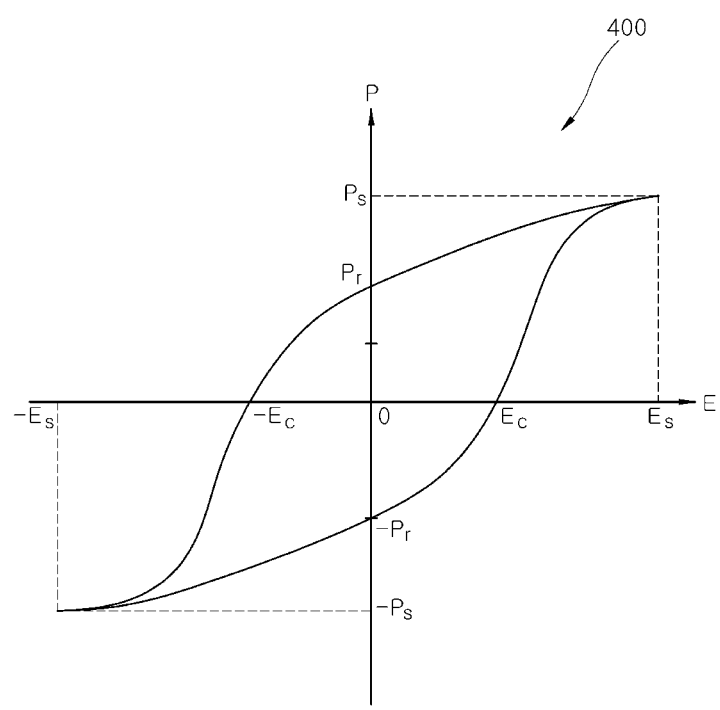
FIG. 4 is a hysteresis graph of a ferroelectric layer of a ferroelectric memory device according to an embodiment of the present disclosure.

FIG. 4 is a hysteresis graph of a ferroelectric layer of a ferroelectric memory device according to an embodiment of the present disclosure. Referring to the graph 400 of FIG. 4, the ferroelectric layer according to an embodiment of the present disclosure may exhibit a hysteresis operation having first and second coercive electric fields Ec and −Ec, and first and second remanent polarization Pr and −Pr, according to an electric field applied through the ferroelectric layer. At first, when a positive electric field is applied to the ferroelectric layer having a predetermined second remanent polarization −Pr, the magnitude of polarization having a negative polarity can be decreased as the electric field increases in a positive direction. When the applied electric field increases to a magnitude greater than the first coercive electric field Ec, a polarization state in the ferroelectric layer can be switched from a polarization having a negative value to a polarization having a positive value. When the applied electric field reaches a first saturation electric field Es or greater, the ferroelectric layer may have the first saturation polarization Ps. When the applied electric field is decreased again to the first saturation field Es or lower, the magnitude of the polarization may also be decreased along the curve of the graph. When the applied electric field is removed, the ferroelectric layer may retain the first remanent polarization Pr.

When a negative electric field is subsequently applied to the ferroelectric layer having the first remanent polarization Pr, the magnitude of polarization having a positive value may decrease as the absolute value of the electric field increases. When the absolute value of the applied electric field is increased in the negative direction to be greater than the absolute value of the second coercive electric field −Ec, the polarization orientation in the ferroelectric layer can be switched from polarization having a positive value to polarization having a negative value. When the electric field increases in the negative direction to the second saturation electric field −Es or greater, the ferroelectric layer may have second saturation polarization −Ps. Then, when the absolute value of the applied electric field is reduced to the absolute value of the second saturation electric field −Es or less, the magnitude of the polarization having a negative value can be reduced along the graph in FIG. 4. When the applied electric field is removed, the ferroelectric layer may retain the second remanent polarization −Pr.

Figure 5A:
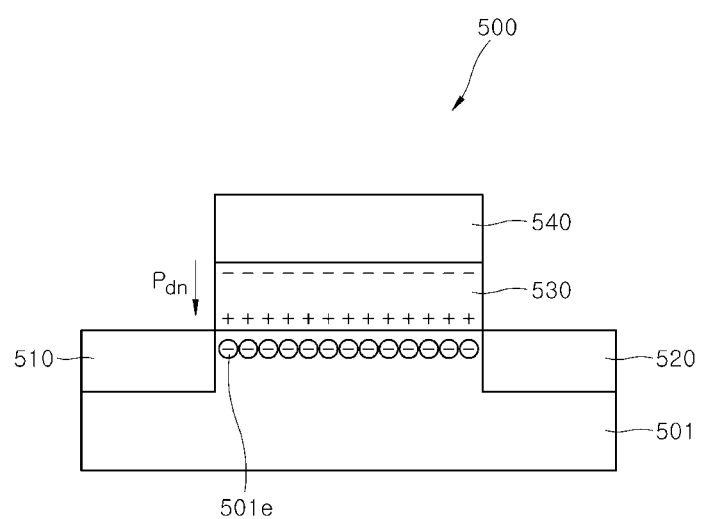
FIGS. 5A and 5B are cross-sectional views schematically illustrating an operation principle of a ferroelectric memory device.
Figure 5B:
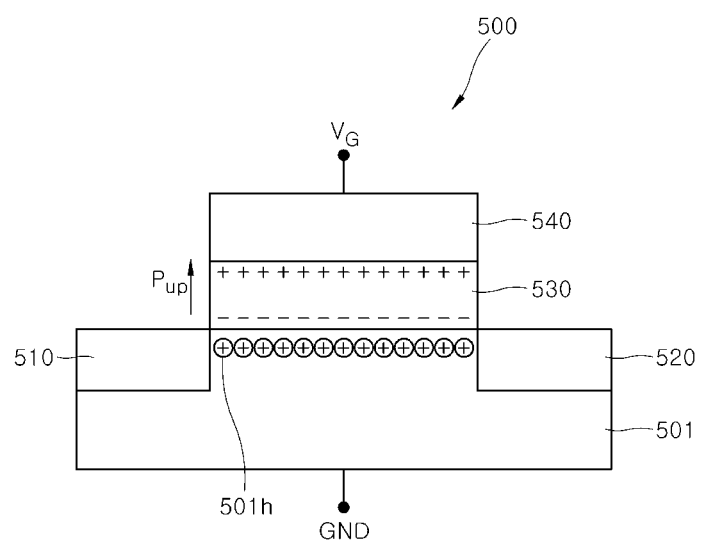

FIGS. 5A and 5B are cross-sectional views schematically illustrating an operation principle of a ferroelectric memory device 500. Referring to FIGS. 5A and 5B, the ferroelectric memory device 500 may include a substrate 501, a ferroelectric layer 530 and a gate electrode layer 540. A source region 510 and a drain region 520 may be disposed in a substrate 501 region at opposite ends of the gate electrode layer 540. The substrate 501 may be a p-type doped semiconductor substrate, and the source region 510 and a drain region 520 may be n-type doped regions of the substrate 501.

Referring to FIG. 5A, the ferroelectric layer 530 may have remanent polarization having a first polarization orientation $P_{dn}$. As an example, the remanent polarization may correspond to the first remanent polarization Pr of FIG. 4. At this time, the first polarization orientation $P_{dn}$ may be oriented in a direction from the gate electrode layer 540 toward the substrate 501. That is, positive charges may be charged or arranged in an inner region of the ferroelectric layer 530 adjacent to the substrate 501 and negative charges may be charged or accumulate in an inner region of the ferroelectric layer 530 adjacent to the gate electrode layer 540. The remanent polarization having the first polarization orientation $P_{dn}$ can induce electrons 501e in a channel region of the substrate 501 located below the gate electrode layer 540.

Referring to FIG. 5B, a voltage may be applied between the gate electrode layer 540 and the substrate 501 of the ferroelectric memory device 500 of FIG. 5A. As an example, a predetermined gate voltage $V_G$ having a negative polarity may be applied to the gate electrode layer 540 and the substrate 501 may be grounded. When an absolute value of the applied gate voltage $V_G$ is increased in magnitude to be greater than a voltage corresponding to an absolute value of a coercive electric field of the ferroelectric layer 530, polarization switching may occur inside the ferroelectric layer 530. As an example, when an absolute value of the gate electrode $V_G$ is increased greater than a voltage corresponding to an absolute value of the second coercive electric field −Ec of FIG. 4, the polarization orientation inside the ferroelectric layer 530 may be switched to a second polarization orientation $P_{up}$. At this time, the electrons 501e may be expelled from the channel region and holes 501h may be induced in the channel region of the substrate 501. When the absolute value of the gate voltage $V_G$ is increased in a negative direction greater than a voltage corresponding to the second saturation electric field −Es of FIG. 4, and then removed, the ferroelectric layer 530 may retain remanent polarization corresponding to the second remanent polarization −Pr of FIG. 4. Although not illustrated, when a gate voltage $V_G$ greater than a voltage corresponding to the first coercive electric field Ec is subsequently applied to the gate electrode layer 540 of the ferroelectric memory device 500 of FIG. 5B, the polarization orientation inside the ferroelectric layer 530 can be switched back to the first polarization orientation $P_{dn}$. At this time, electrons 501e may be induced again in the channel region of the substrate 501.

Figure 6A:
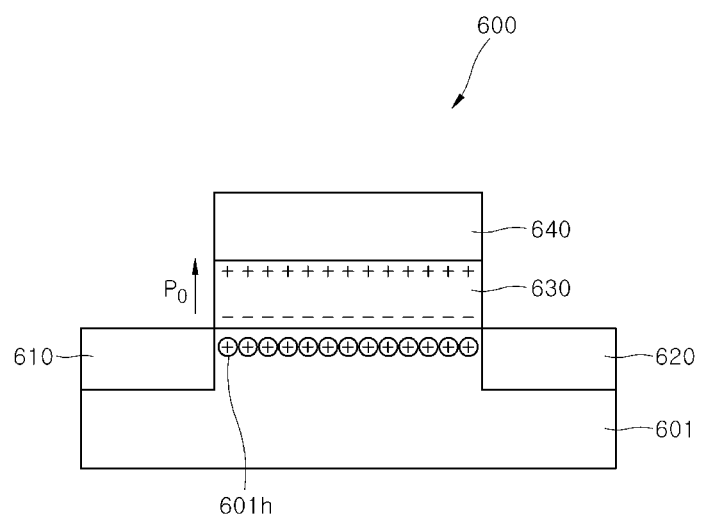
FIGS. 6A to 6C are cross-sectional views schematically illustrating an operation principle of a ferroelectric memory device according to an embodiment of the present disclosure.
Figure 6B:
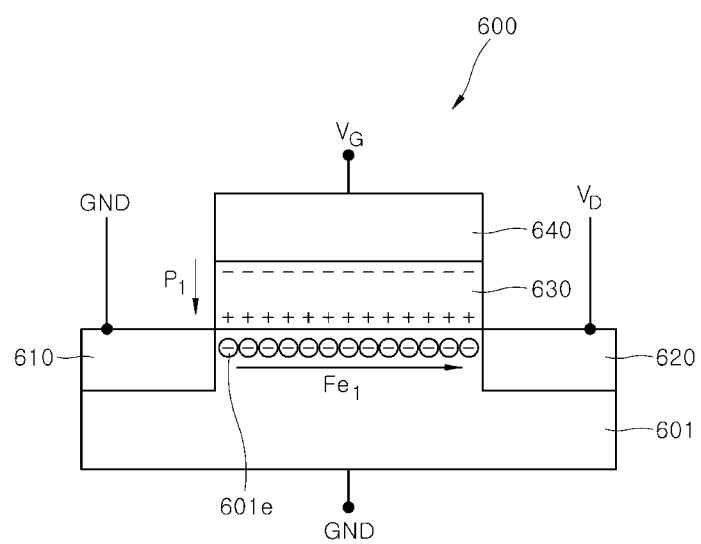
Figure 6C:
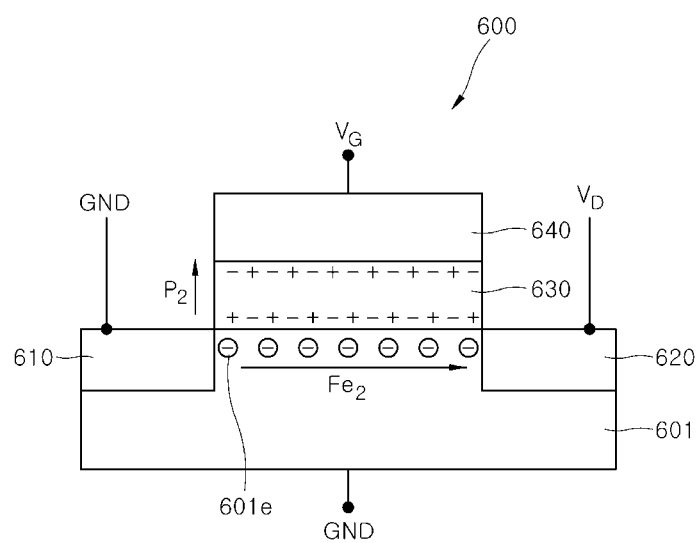

FIGS. 6A to 6C are cross-sectional views schematically illustrating an operation principle of a ferroelectric memory device 600 according to an embodiment of the present disclosure. Referring to FIGS. 6A to 6C, the ferroelectric memory device 600 may include a substrate 601, a ferroelectric layer 630 and a gate electrode layer 640. A source region 610 and a drain region 620 may be disposed in substrate 601 regions at opposite ends of the gate electrode 640. The substrate 601 may be a p-type doped semiconductor substrate, and the source region 610 and the drain region 620 may be n-type doped regions of the substrate 601.

Referring to FIG. 6A, in an initial state, the ferroelectric layer 630 may have a predetermined remanent polarization $P_0$ having the second polarization orientation $P_{up}$ of FIG. 5B. As an example, the remanent polarization $P_0$ may correspond to the second remanent polarization −Pr of FIG. 4. At this time, holes 601h induced by the remanet polarization $P_0$ may be distributed in a channel region of the substrate 601.

Referring to FIGS. 6B and 6C, a predetermined drain voltage $V_D$ may be applied to the drain region 620 and the source region 610 is grounded so that a potential difference may occur between the source region 610 and the drain region 620. As an example, the drain voltage $V_D$ may have a positive polarity.

In an embodiment, a gate voltage $V_G$ that is greater than 0 V and less than a voltage corresponding to the coercive electric field of the ferroelectric layer 630 may be applied to the gate electrode layer 640 while the substrate 601 is grounded. In this case, although the gate voltage $V_G$ does not cause the polarization switching of the ferroelectric layer 630, the resistance of the channel region in the substrate 601 can be reduced. As a result, a first electron conduction $F_{e1}$ and a second electron conduction $F_{e2}$ passing through the channel region can be generated by the potential difference between the source region 610 and the drain region 620, as illustrated in FIGS. 6B and 6C respectively. Electrons 601e can electrically charge inner regions or areas of the channel region adjacent to the ferroelectric layer 630 with negative charges while the first and second electron conductions $F_{e1}$ and $F_{e2}$ proceed.

In the meantime, during the first and second electron conductions $F_{e1}$ and $F_{e2}$, the polarization switching of the ferroelectric layer 630 may occur by the negative charges charged in the inner regions of the channel region. The degree of the polarization switching may vary depending on the density of the electrons 601e passing through the channel region.

As an example, comparing the embodiments of FIGS. 6B and 6C, when the gate voltage $V_G$ of the same magnitude is applied, the amount of charge of the first electron conduction $F_{e1}$ shown in the embodiment of FIG. 6B may be controlled to be greater than the amount of charge of the second electron conduction $F_{e2}$ shown in the embodiment of FIG. 6C. That is, the current that conducts between the source region 610 and the drain region 620 in the embodiment of FIG. 6B may be greater than the current that conducts between the source region 610 and the drain region 620 in the embodiment of FIG. 6C. Accordingly, in the embodiment of FIG. 6B, since the amount of the charge occupying the channel layer is relatively greater than that illustrated in the embodiment of FIG. 6C, a driving force for inducting the inner region of the ferroelectric layer 630 adjacent to the channel layer with positive electric charge may be relatively greater in the embodiment of FIG. 6B. Accordingly, in the embodiment of FIG. 6B, the degree of polarization switching occurring in the ferroelectric layer 630 may be relatively great or larger. As a result, after the polarization switching, the ferroelectric layer 630 can have a remanent polarization $P_1$ having the first polarization orientation $P_{dn}$. As an example, the remanent polarization $P_1$ may correspond to the first remanent polarization Pr of FIG. 4.

In contrast, in the embodiment of FIG. 6C, since the amount of the charge occupying the channel region is relatively smaller or lower, the driving force of the polarization switching may be relatively smaller or less. As a result, relatively weaker polarization switching takes place, and thus the ferroelectric layer 630 has a remanent polarization $P_2$ that keeps the second polarization orientation $P_{up}$ of the initial state shown in FIG. 6A. Alternatively, In another example, although not illustrated, even if polarization switching to the first polarization orientation $P_{dn}$ occurs, the ferroelectric layer 630 can still have a remanent polarization value smaller than the remanent polarization $P_1$ shown in the embodiment of FIG. 6B.

As described above, in the embodiment of the present disclosure, in a state where a write voltage greater than a voltage corresponding to the coercive electric field of the ferroelectric layer is applied to the gate electrode layer of the ferroelectric memory device, polarization switching of different degrees can be generated in the ferroelectric layer by controlling a current passing through the channel layer. As a result of varying polarization switching magnitudes or degrees, different remanent polarization can be stored in the ferroelectric layer. By using the above operation principle, it is possible to store multi-level signal information in the ferroelectric layer in a nonvolatile manner. The magnitude of the current passing through the channel region can be controlled by the control transistor as described later.

Figure 7:
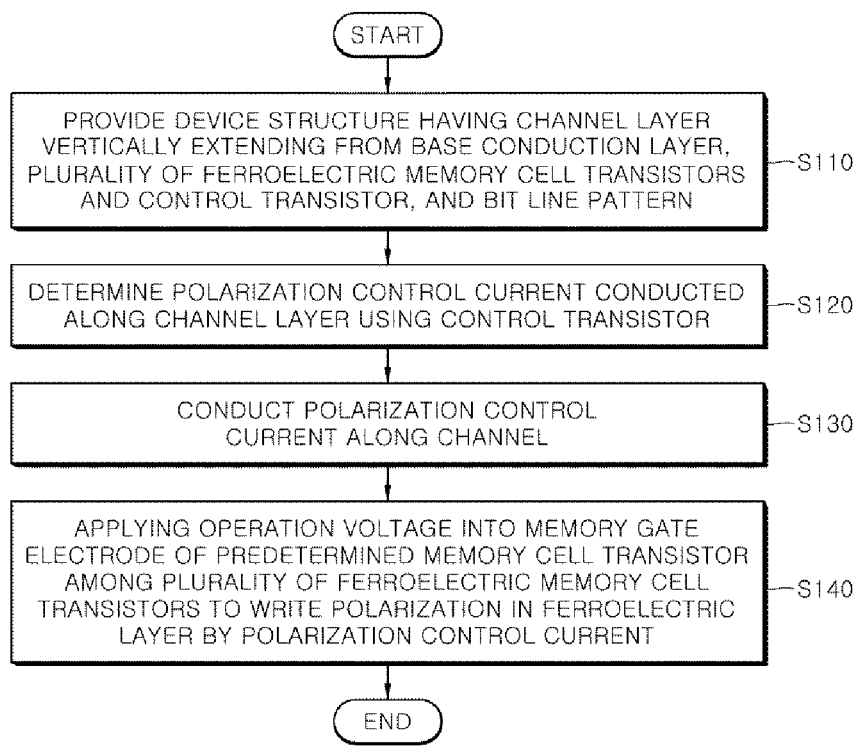
FIG. 7 is a flow chart schematically illustrating a method of operating a ferroelectric memory device according to an embodiment of the present disclosure.
Figure 8:
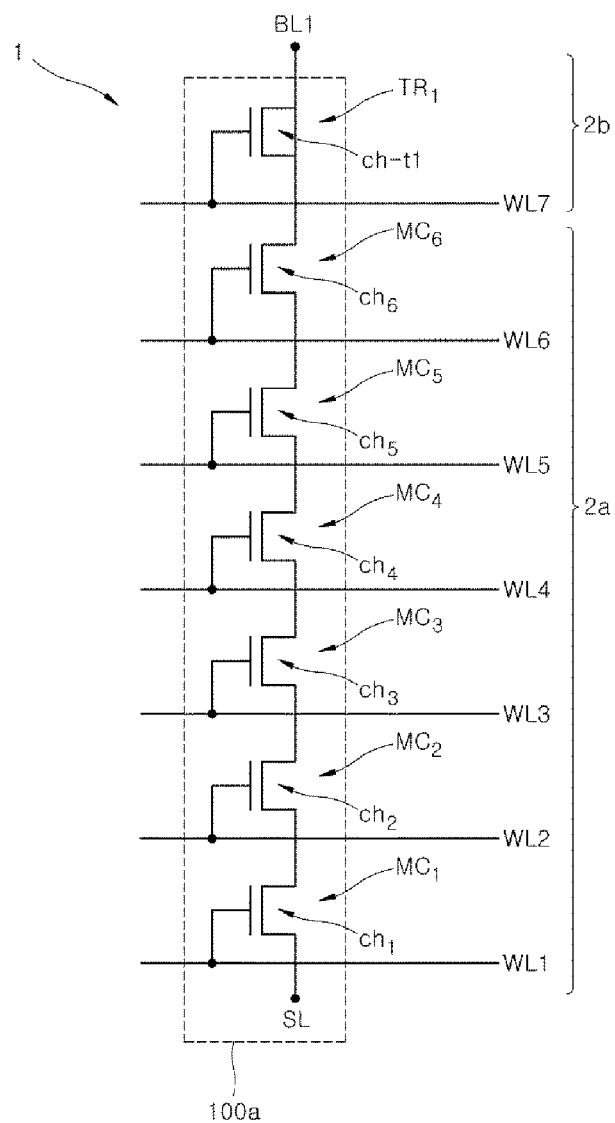
FIGS. 8 to 10 are views schematically illustrating a method of operating a ferroelectric memory device according to an embodiment of the present disclosure.
Figure 9:
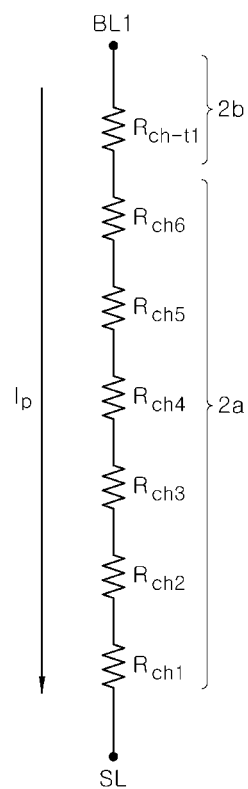
Figure 10:
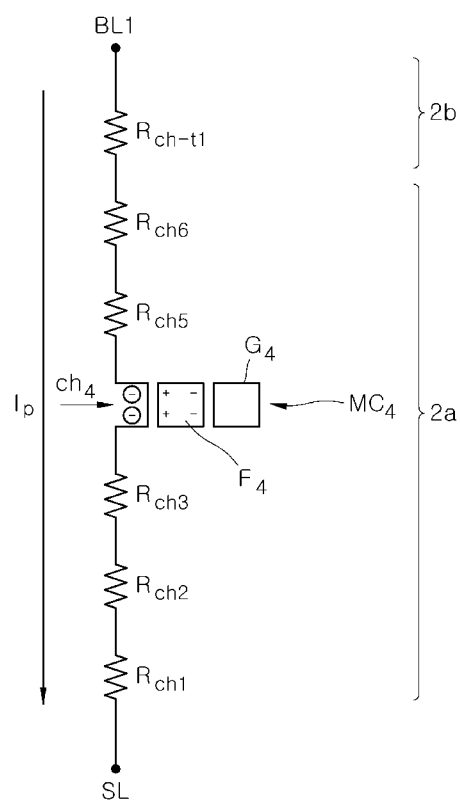

FIG. 7 is a flow chart schematically illustrating a method of operating a ferroelectric memory device according to an embodiment of the present disclosure. FIGS. 8 to 10 are schematic views schematically illustrating the method of operating the ferroelectric memory device according to an embodiment of the present disclosure. In an embodiment, the method of operating the ferroelectric memory device may be implemented using the ferroelectric memory device 1 described above and with reference to FIGS. 1, 2, 3A and 3B.

Referring to S110 of FIG. 7, there is provided a device structure having a channel layer 150 extending vertically from a base conduction layer 105 on a substrate 100, a plurality of ferroelectric memory cell transistors 2a and a control transistor 2b that share the channel layer 150, and a bit line pattern 160 electrically connected to the channel layer 150. The plurality of ferroelectric memory cell transistors 2a may include a ferroelectric layer 142 and memory gate electrode layers 210a, 210b, 201c, 210d, 210e and 210f, and the control transistor 2b may include a control dielectric layer 143 and a control gate electrode 210g. Since the plurality of ferroelectric memory cell transistors 2a share the ferroelectric layer 142 and the channel layer 150, the length or area of the channel layer 150 controlled by each of the plurality of ferroelectric memory cell transistors 2a may be determined by the thickness of corresponding memory gate electrode layers 210a, 210b, 201c, 210d, 210e and 210f, respectively. In addition, the length or area of the channel layer 150 controlled by the control transistor 2b may be determined by the thickness of the control gate electrode layer 210g. The device structure may be implemented as a string 100a shown in FIG. 8, as an embodiment. The string 100a illustrated in FIG. 8 may be one of the plurality of strings such as 100a and 100b described above and with reference FIG. 1.

Referring to S120 of FIG. 7, a polarization control current that is conducted along the channel layer 150 may be determined using the control transistor 2b. In an embodiment, determining the polarization control current may be performed as follows. First, a displacement current required for polarization switching of the ferroelectric layer 142 of a predetermined memory cell transistor may be determined. The displacement current may be determined by the amount of charges required to be distributed in the channel layer 150 to write desired polarization in the ferroelectric layer 142 of a predetermined memory cell transistor. Then, the magnitude of the control voltage to be applied to the control gate electrode layer 210g may be determined such that a channel current corresponding to the displacement current is conducted through the channel layer 150. In an embodiment, the channel current may have two or more different values depending on the magnitude of the polarization written in the ferroelectric layer 150 as will be described later, and the magnitude of the corresponding control voltage may be determined depending on the channel current.

Referring to S130 of FIG. 7, the polarization control current may be conducted along the channel layer 150, between the base conduction layer 105 and the bit line pattern 160. In an embodiment, conducting the polarization control current may include applying a first write voltage to the memory gate electrode layers 210a, 210b, 201c, 210d, 210e and 210f to decrease the electric resistance of the channel layer 150. At this time, the first write voltage may be lower than a voltage corresponding to an absolute value of a coercive field of the ferroelectric layer 142. That is, when the first write voltage is applied to the memory gate electrode layers 210a, 210b, 201c, 210d, 210e and 210f, the polarization control current cannot generate polarization orientation switching with respect to the portions of ferroelectric layer 142 corresponding to the plurality of ferroelectric memory cell transistors 2a.

Referring to FIG. 9, step S130 can be visualized as polarization control current $I_p$ controlled by the control transistor 2b passes through the circuit in which the first to sixth channel resistances $R_{ch1}$, $R_{ch2}$, $R_{ch3}$, $R_{ch4}$, $R_{ch5}$ and $R_{ch6}$ and a first control resistance $R_{cht1}$ are connected in series to be conducted between the source line SL and the bit line BL1.

Referring to S140 of FIG. 7, an operating voltage may be applied into one or more memory gate electrode layers 210a, 210b, 201c, 210d, 210e and 210f of selected memory cell transistors among the plurality of ferroelectric memory cell transistors 2a to cause the polarization control current to write the polarization in the ferroelectric layer 142 of the predetermined memory cell transistor. In an embodiment, applying the operating voltage into the memory gate electrode layers 210a, 210b, 201c, 210d, 210e and 210f may include applying a second write voltage to the memory gate electrode layers 210a, 210b, 201c, 210d, 210e and 210f. At this time, the second write voltage may be higher than a voltage corresponding to an absolute value of a coercive field of the ferroelectric layer 142. That is, when the second write voltage is applied to the memory gate electrode layers 210a, 210b, 201c, 210d, 210e and 210f, the polarization control current may generate polarization switching with respect to the ferroelectric layer 142 corresponding to the predetermined or selected memory cell transistor.

For example, referring to FIG. 10, when the fourth memory cell transistor $MC_4$ is selected among the plurality of ferroelectric memory cell transistors 2a, the polarization control current $I_p$ can conduct charges in the channel layer $ch_4$. When the second write voltage is applied to the memory gate electrode layer $G_4$, the conducted charges may switch the polarization in the ferroelectric layer $F_4$.

As described above, writing polarization in a ferroelectric layer of a predetermined memory cell transistor may include changing a magnitude of the polarization control current using the control transistor 2b to switch or vary the polarization orientation and/or magnitude of the ferroelectric layer to different degrees. Thus, multi-level signal information can be stored in the ferroelectric layer of a single memory cell transistor.

Figure 11:
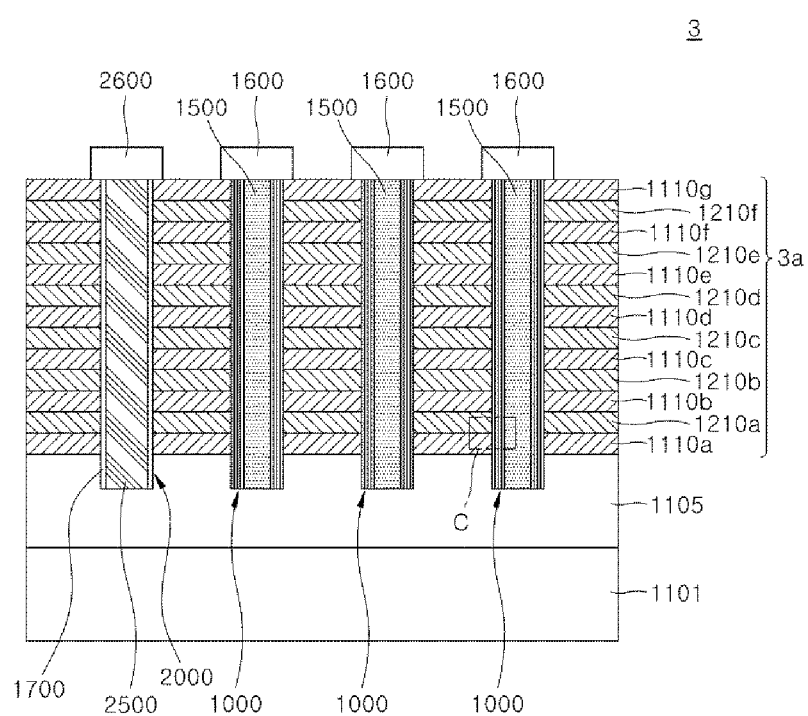
FIG. 11 is a cross-sectional view schematically illustrating a ferroelectric memory device according to another embodiment of the present disclosure.
Figure 12:
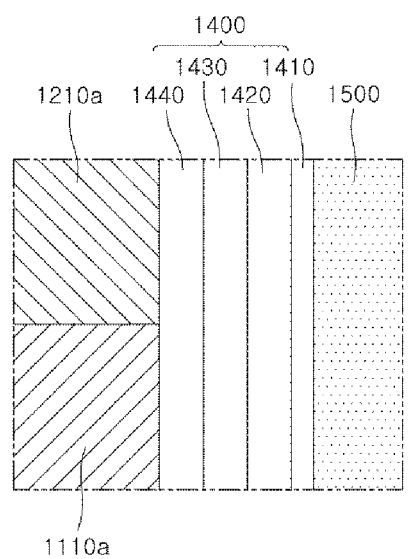
FIG. 12 is an enlarged view of a region C of FIG. 11.

FIG. 11 is a cross-sectional view schematically illustrating a ferroelectric memory device 3 according to another embodiment of the present disclosure. FIG. 12 is an enlarged view of region C of FIG. 11.

Referring to FIGS. 11 and 12, the ferroelectric memory device 3 may include a substrate 1101, a base conduction layer 1105, a channel layer 1500, a ferroelectric structure 1400, a plurality of ferroelectric memory cell transistors 3a, and a bit line pattern 1600. The channel layer 1500 may extend vertically from the base conduction layer 1105. The plurality of ferroelectric memory cell transistors 3a may share the channel layer 1500 with each other. As illustrated in FIG. 12, each of the plurality of ferroelectric memory cell transistors 3a may include a portion of ferroelectric structure 1400 disposed adjacent to the channel layer 1500.

The substrate 1101 may be a semiconductor substrate. A configuration of the substrate 1101 may be substantially the same as that of the substrate 101 described above and with reference to FIG. 2. The base conduction layer 1105 may be disposed on the substrate 1101. A configuration of the base conduction layer 1105 may be substantially the same as that of the base conduction layer 105 described above and with reference to FIG. 2.

First to seventh interlayer insulating layers 1110a, 1110b, 1110c, 1110d, 1110e, 1110f and 1110g and first to sixth gate electrode layers 1210a, 1210b, 1210c, 1210d, 1210e and 1210f may be alternately stacked on the base conduction layer 1105. At this time, the first interlayer insulating layer 1110a may contact the base conduction layer 1105. The plurality of ferroelectric memory cell transistors 3a may include the first to sixth gate electrode layers 1210a, 1210b, 1210c, 1210d, 1210e and 1210f as memory gate electrode layers, respectively. Although six memory cell transistors corresponding to the first to sixth gate electrode layers 1210a, 1210b, 1210c, 1210d, 1210e and 1210f are shown in FIG. 11 for the convenience of description, the number of the memory cell transistors need not be so limited. That is, in some other embodiments, the plurality of ferroelectric memory cell transistors 3a may include a different number of memory cell transistors and a different number of interlayer insulating layers corresponding to a different number of memory cell transistors.

The configurations of the first to seventh interlayer insulating layers 1110a, 1110b, 1110c, 1110d, 1110e, 1110f and 1110g and the first to sixth gate electrode layers 1210a, 1210b, 1210c, 1210d, 1210e and 1210f may be substantially the same as those of the first to seventh interlayer insulating layers 110a, 110b, 110c, 110d, 110e, 110f and 110g and the first to sixth gate electrode layers 210a, 210b, 210c, 210d, 210e and 210f described above and with reference to FIG. 2. In the ferroelectric memory device 3, the control transistor 2b of FIG. 2 and FIG. 3A may be omitted.

Referring again to FIG. 11, a first trench 1000 may be formed to penetrate the first to seventh interlayer insulating layers 1110a, 1110b, 1110c, 1110d, 1110e, 1110f and 1110g and the first to sixth gate electrode layers 1210a, 1210b, 1210c, 1210d, 1210e and 1210f and to expose the base conduction layer 1105. The channel layer 1500 extending vertically or in a first direction from the base conduction layer 1105 may be disposed in the first trench 1000. The configurations of the first trench 1000 and the channel layer 1500 may be substantially the same as those of the trench 10 and the channel layer 150 described above and with reference to FIG. 2.

The ferroelectric structures 1400 may be disposed between the channel layer 1500 and the first to seventh interlayer insulating layers 1110a, 1110b, 1110c, 1110d, 1110e, 1110f and 1110g and between the channel layer 1500 and the first to sixth gate electrode layers 1210a, 1210b, 1210c, 1210d, 1210e and 1210f.

The ferroelectric structure 1400 may include a plurality of ferroelectric layers. At this time, one or more ferroelectric layers has a different coercive field. In an embodiment, first to third ferroelectric layers 1420, 1430 and 1440 having different coercive fields are illustrated in FIGS. 11 and 12. However, the number of the ferroelectric layers constituting the ferroelectric structure 1400 may not be limited. That is, the ferroelectric structure 1400 may have various numbers of ferroelectric layers and need not be limited to the layers illustrated in FIGS. 11 and 12.

Referring to FIGS. 11 and 12, the ferroelectric structure 1400 may further include an interfacial insulating layer 1410 in contact with the channel layer 1500. The interfacial insulating layer 1410 may function as a buffer layer for preventing direct contact of the first ferroelectric layer 1420 and the channel layer 1500. When the channel layer 1500 and the first ferroelectric layer 1420 are in direct contact with each other, defect sites may be generated at a junction interface and the electrical retention of the ferroelectric structure 1400 may be degraded or deteriorate during device operation.

In an embodiment, each of the first to third ferroelectric layers 1420, 1430 and 1440 may include a ferroelectric material. The ferroelectric material may include, for example, hafnium oxide, zirconium oxide, hafnium zirconium oxide or a combination thereof. In an embodiment, at least one of the first to third ferroelectric layers 1420, 1430 and 1440 may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Ga), or a combination of two or more thereof.

The first to third ferroelectric layers 1420, 1430 and 1440 may include different coercive fields. The coercive field can be interpreted as a resistive force in which the ferroelectric layer attempts to maintain the existing polarization orientation against the external stimulus. In an embodiment, the different coercive fields can be implemented by changing the strain inside the ferroelectric layer by implanting dopants at different concentrations with respect to the first to third ferroelectric layers 1420, 1430 and 1440. In another embodiment, the different coercive fields can be implemented by controlling the first to third ferroelectric layers 1420, 1430 and 1440 to have different grain sizes to change the size of a polarization domain. The first to third ferroelectric layers 1420, 1430 and 1440 have different coercive fields, so that the polarization switching of the first to third ferroelectric layers 1420, 1430 and 1440 can occur when an external electric field having a magnitude equal to or greater than the respective coercive filed is applied.

The bit line pattern 1600 electrically connected to the channel layer 1500 may be disposed over the channel layer 1500. The bit line pattern 1600 may be a portion of a bit line or a connection pattern electrically connected to the bit line. A configuration of the bit line pattern 1600 may be substantially the same as that of the bit line pattern 160 described above and with reference to FIG. 2.

Referring again to FIG. 11, a second trench 2000 may be formed to penetrate the first to seventh interlayer insulating layers 1110a, 1110b, 1110c, 1110d, 1110e, 1110f and 1110g and the first to sixth gate electrode layers 1210a, 1210b, 1210c, 1210d, 1210e and 1210f to expose the base conduction layer 1105. A liner insulating layer 1700 may be disposed on a sidewall of the second trench 2000. A first source line connection pattern 2500 may be disposed inside the second trench 2000. A second source line connection pattern 2600 connected to the first source line connection pattern 2500 may be disposed outside the second trench 2000. The first and second source line connection patterns 2500 and 2600 can electrically connect the base conduction layer 1105 to a source line (not illustrated). Configurations of the second trench 2000, the liner insulating layer 1700, the first and second source line connection patterns 2500 and 2600 may be substantially the same as those of the second trench 20, the liner insulating layer 170, the first and second line connection patterns 250 and 260 described above and with reference to FIG. 2.

As described above, the ferroelectric memory device according to an embodiment of the present disclosure has a ferroelectric structure disposed between a channel layer extending in a vertical direction and a memory gate electrode layer extending in a horizontal or second direction. The ferroelectric structure may include a plurality of ferroelectric layers each with different coercive fields. The polarization state of the ferroelectric structure is controlled by the plurality of ferroelectric layers having different coercive fields, so that multi-layer signal information can be stored in a predetermined ferroelectric memory cell transistor.

Figure 13:
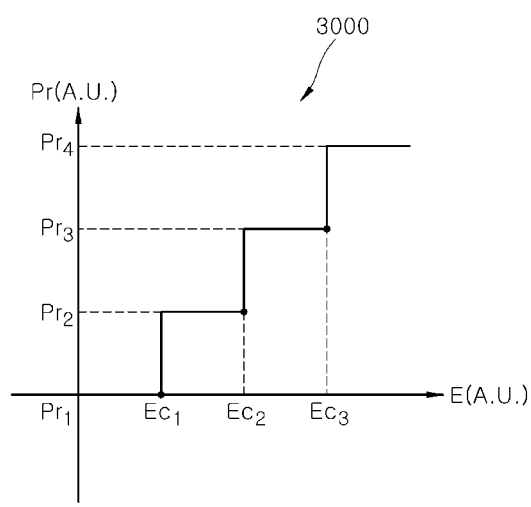
FIG. 13 is a view schematically illustrating a method of operating a ferroelectric memory device according to an embodiment of the present disclosure.

FIG. 13 is a view schematically illustrating a method of operating a ferroelectric memory device according to an embodiment of the present disclosure. The operating method of FIG. 13 can be implemented using the ferroelectric memory device 3 described above and with reference to FIGS. 11 and 12.

In a specific embodiment, a write method of the ferroelectric memory device 3 to be described in connection with FIG. 13 can apply the operation principle described above and with reference to FIGS. 5A and 5B. That is, a predetermined ferroelectric memory cell transistor may be selected among the plurality of ferroelectric memory cell transistors 3a in the ferroelectric memory device 3. Next, when an electric field greater than the coercive field of any one of the plurality of ferroelectric layers 1420, 1430 and 1440 is applied through the memory gate electrode layer of the selected ferroelectric memory cell transistor, polarization switching can occur within the ferroelectric structure 1400.

A graph 3000 of FIG. 13 illustrates remanent polarization $Pr_x$ varying depending on an electric field applied to the ferroelectric structure 1400. As an example, the ferroelectric structure 1400 may have the first to third ferroelectric layers 1420, 1430 and 1440, and the first to third ferroelectric layers 1420, 1430 and 1440 may have corresponding coercive fields $E_{c1}$, $E_{c2}$ and $E_{c3}$, respectively. At this time, the coercive fields may have values in the order of the third field electric field $E_{c3}$, the second field electric field $E_{c2}$, and the first field electric field $E_{c1}$.

In an embodiment, an external electric field having a magnitude smaller than an absolute value of the first coercive field $E_{c1}$ may be applied to the ferroelectric structure 1400. At this time, polarization switching does not occur in the ferroelectric structure 1400. When the electric field is removed after applying the electric field having a magnitude smaller than an absolute value of the first coercive field $E_{c1}$, the ferroelectric structure 1400 can retain first remanent polarization $Pr_1$ and maintain the existing polarization orientation.

In another embodiment, an external electric field having a magnitude equal to or greater than the absolute value of the first coercive field $E_{c1}$ but smaller than an absolute value of the second coercive field $E_{c2}$ may be applied to the ferroelectric structure 1400. At this time, in the ferroelectric structure 1400, polarization switching may occur in the first ferroelectric layer 1420 corresponding to the applied electric field. However, polarization switching does not occur in the second and third ferroelectric layers 1430 and 1440. When the electric field is removed after applying the electric field having a magnitude equal to or greater than the absolute value of the first coercive field $E_{c1}$ and smaller than the absolute value of the second coercive field $E_{c2}$, the ferroelectric structure 1400 may retain second remanent polarization $Pr_2$ while and have a switched polarization orientation.

In another embodiment, an external electric field having a magnitude equal to or greater than the absolute value of the second coercive field $E_{c2}$ but smaller than an absolute value of the third coercive field $E_{c3}$ may be applied to the ferroelectric structure 1400. Then, in the ferroelectric structure 1400, polarization switching may occur in the first and second ferroelectric layers 1420 and 1430 corresponding to the applied electric field. However, the polarization switching may not occur in the third ferroelectric layer 1440. When the electric field is removed after applying the electric field having a magnitude equal to or greater than the absolute value of the second coercive field $E_{c2}$ and smaller than the absolute value of the third coercive field $E_{c3}$, the ferroelectric structure 1400 may have third remanent polarization $Pr_3$ and a switched polarization orientation. An absolute value of the third remanent polarization $Pr_3$ may be greater than an absolute value of the second remanent polarization $Pr_2$.

In another embodiment, an external electric field having a magnitude equal to or greater than the absolute value of the third coercive field $E_{c3}$ may be applied to the ferroelectric structure 1400. At this time, in the ferroelectric structure 1400, polarization switching may occur in the first to third ferroelectric layers 1420, 1430 and 1440 corresponding to the applied electric field. When the electric field is removed after applying the electric field having a magnitude equal to or greater than the absolute value of the third coercive field $E_{c3}$, the ferroelectric structure 1400 may have fourth remanent polarization $Pr_4$ and a switched polarization orientation. At this time, an absolute value of the fourth remanent polarization $Pr_4$ may be greater than the absolute value of the third remanent polarization $Pr_3$. As described above, multilevel signal information can be stored in a single memory cell transistor by using a plurality of remanent polarization $Pr_1$, $Pr_2$, $Pr_3$ and $Pr_4$ that are formed with different magnitudes in response to an applied external electric field.

Graph 3000 of FIG. 13 illustrates that the same first polarization $Pr_1$ is provided in a first electric field period where the applied current is greater than 0 and smaller than the first coercive field $E_{c1}$, the same second polarization $Pr_2$ is provided in a second electric field period where the applied current is equal to or greater than the first coercive field $E_{c1}$ and smaller than the second coercive field $E_{c2}$, the same third polarization $Pr_3$ is provided in a third electric field period where the applied current is equal to or greater than the second coercive field $E_{c2}$ and smaller than the third coercive field $E_{c3}$, and the same fourth polarization $Pr_4$ is provided in a fourth electric field period where the applied current is equal to or greater than the third coercive field $E_{c3}$ and smaller than the fourth coercive field $E_{c4}$.

There may be other variations. That is, the magnitude of the remanent polarization may be different depending on the magnitude of the applied electric field even within the same electric field period. In such cases, however, the difference in the magnitude of the remanent polarization in the same electric field period (i.e., between 0 and $E_{c1}$, between $E_{c1}$ and $E_{c2}$, between $E_{c2}$ and $E_{c3}$, and between $E_{c3}$ and $E_{c4}$) may be extremely small compared to the difference in the remanent polarization between the different electric field periods. Accordingly, the multilevel signal information can be effectively implemented by using the difference in the residual polarization occurring between different electric field periods.

Although it is not illustrated, in some other embodiments, a method of operating the ferroelectric memory device 3 may utilize a method using the polarization control currents described herein and with reference to FIGS. 6A to 6C. In this case, a control transistor may be further included between the plurality of memory cell transistors 3a and the bit line pattern 1600 and between the plurality of memory cell transistors 3a and the base conduction layer 1105. The polarization control current controlled by the control transistor can control polarization switching inside the plurality of memory cell transistors 3a.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A ferroelectric memory device comprising:
a base conduction layer;
a channel layer extending in a vertical direction from the base conduction layer;
a ferroelectric layer disposed on the channel layer;
a plurality of ferroelectric memory cell transistors stacked in a vertical direction on the base conduction layer, each of the ferroelectric memory cell transistors comprising a portion of the ferroelectric layer and a memory gate electrode layer disposed on the ferroelectric layer in a horizontal direction;
a control transistor disposed over the plurality of ferroelectric memory cell transistors comprising a control dielectric layer disposed on the channel layer and a control gate electrode layer disposed on the control dielectric layer in a horizontal direction; and
a bit line pattern electrically connected to the channel layer,
wherein the memory gate electrode layers and the control gate electrode layer each comprise at least one of tungsten (W), titanium (Ti), copper (Cu), ruthenium (Ru), tungsten nitride (WN), titanium nitride (TiN), tantalum nitride (TaN), ruthenium oxide (RuO2), tungsten carbide (WC), titanium carbide (TiC), tungsten silicide (WSi2), titanium silicide (TiSi2), and tantalum silicide (TaSi2).

2. The ferroelectric memory device of claim 1, wherein the plurality of ferroelectric memory cell transistors and the control transistor share the channel layer.

3. The ferroelectric memory device of claim 1, wherein the ferroelectric memory cell transistors further comprise a plurality of interlayer insulating layers, wherein the interlayer insulating layers are alternately stacked with the memory gate electrodes in a vertical direction from the base conduction layer.

4. The ferroelectric memory device of claim 1, wherein the channel layer comprises an n-type or a p-type doped semiconductor material.

5. The ferroelectric memory device of claim 1, wherein the ferroelectric layer comprises at least one of hafnium oxide, zirconium oxide, and hafnium zirconium oxide.

6. The ferroelectric memory device of claim 1, wherein the ferroelectric layer comprises at least one of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), and gadolinium (Ga) as a dopant.

7. The ferroelectric memory device of claim 1, wherein the control dielectric layer comprises a paraelectric material, and wherein the paraelectric material comprises at least one of silicon oxide, silicon nitride, aluminum oxide, silicon oxynitride, hafnium oxide and zirconium oxide.

8. A ferroelectric memory device comprising:
a base conduction layer;
a channel layer extending in a vertical direction from the base conduction layer;
a ferroelectric structure;
a plurality of ferroelectric memory cell transistors stacked in a vertical direction on the base conduction layer, each of the ferroelectric memory cell transistors including a portion of the ferroelectric structure adjacent to the channel layer and a memory gate electrode layer disposed on the ferroelectric structure; and
a bit line pattern electrically connected to the channel layer over the plurality of ferroelectric memory cell transistors,
wherein the ferroelectric structure comprises a first ferroelectric layer and a second ferroelectric layer,
wherein both of the first ferroelectric layer and the second ferroelectric layer have ferroelectricity, and
wherein a coercive field of the first ferroelectric layer is different from a coercive field of the second ferroelectric layer.

9. The ferroelectric memory device of claim 8, wherein the ferroelectric structure further comprises an interfacial insulating layer in contact with the channel layer.

10. The ferroelectric memory device of claim 8, wherein the first ferroelectric layer and the second ferroelectric layer comprise at least one of hafnium oxide, zirconium oxide, and hafnium zirconium oxide.

11. The ferroelectric memory device of claim 10, wherein at least one of the first ferroelectric layer and the second ferroelectric layer comprises a dopant comprising at least one of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), and gadolinium (Ga).

12. The ferroelectric memory device of claim 8, wherein the first ferroelectric layer and the second ferroelectric layer have a different dopant concentration.

13. The ferroelectric memory device of claim 8, wherein the first ferroelectric layer and the second ferroelectric layer have a different grain size with each other.

14. The ferroelectric memory device of claim 8, wherein the ferroelectric structure has a plurality of remanent polarization based on the coercive fields of the first ferroelectric layer and the second ferroelectric layer.

* * * * *